United States Patent
Fukuda (10) Patent No.: US 9,123,609 B2
(45) Date of Patent: Sep. 1, 2015

(54) SOLID-STATE IMAGING DEVICE, MANUFACTURING METHOD OF SOLID-STATE IMAGING DEVICE AND ELECTRONIC APPARATUS

(75) Inventor: Keiki Fukuda, Kanagawa (JP)

(73) Assignee: SONY CORPORATION (JP)

( * ) Notice: Subject to any disclaimer, the term of this patent is extended or adjusted under 35 U.S.C. 154(b) by 75 days.

(21) Appl. No.: 13/456,440

(22) Filed: Apr. 26, 2012

(65) Prior Publication Data

US 2012/0287297 A1    Nov. 15, 2012

(30) Foreign Application Priority Data

May 10, 2011  (JP) ................................ 2011-104897

(51) Int. Cl.
*H01L 31/0232* (2014.01)
*H01L 27/146* (2006.01)
*G02B 5/30* (2006.01)
*H04N 5/217* (2011.01)
*H04N 13/02* (2006.01)

(52) U.S. Cl.
CPC .......... *H01L 27/1464* (2013.01); *G02B 5/3058* (2013.01); *H01L 27/14618* (2013.01); *H01L 27/14629* (2013.01); *H04N 5/2171* (2013.01); *H04N 13/0225* (2013.01)

(58) Field of Classification Search
CPC ................... H01L 27/14603; H01L 27/14609; H01L 27/14643; H01L 27/14689; H01L 27/14812; H01L 27/14627; H01L 27/14685; H01L 31/115; B82Y 10/00

USPC ............ 257/225, 414, 428, 432; 438/65, 75, 438/144

See application file for complete search history.

(56) References Cited

U.S. PATENT DOCUMENTS

| | | | | |
|---|---|---|---|---|
| 6,215,164 B1 * | 4/2001 | Cao et al. | ...................... | 257/431 |
| 6,325,977 B1 * | 12/2001 | Theil | ......................... | 422/82.05 |
| 6,617,189 B1 * | 9/2003 | Chen et al. | ..................... | 438/48 |
| 6,759,262 B2 * | 7/2004 | Theil et al. | ...................... | 438/48 |
| 6,841,411 B1 * | 1/2005 | Varghese | ........................ | 438/94 |
| 7,288,429 B2 * | 10/2007 | Yaung et al. | .................... | 438/74 |
| 7,446,359 B2 * | 11/2008 | Lee et al. | ....................... | 257/294 |
| 7,541,212 B2 * | 6/2009 | Oh | .................................. | 438/48 |
| 7,545,423 B2 * | 6/2009 | Park et al. | ..................... | 348/294 |
| 8,238,026 B1 * | 8/2012 | Kemme et al. | ............. | 359/489.17 |
| 2003/0085410 A1 * | 5/2003 | Theil | ............................. | 257/99 |
| 2004/0125449 A1 * | 7/2004 | Sales | ............................. | 359/486 |
| 2005/0045799 A1 * | 3/2005 | Deng et al. | .................... | 250/200 |
| 2005/0093086 A1 * | 5/2005 | Yaung et al. | ................... | 257/414 |
| 2005/0277063 A1 * | 12/2005 | Wang et al. | ................... | 430/311 |
| 2006/0061862 A1 * | 3/2006 | Mi et al. | ......................... | 359/486 |
| 2008/0308888 A1 * | 12/2008 | Lee | .................................. | 257/432 |
| 2009/0224345 A1 * | 9/2009 | Lee et al. | ...................... | 257/432 |
| 2010/0328770 A1 * | 12/2010 | Perkins et al. | ................ | 359/486 |
| 2012/0287297 A1 * | 11/2012 | Fukuda | ....................... | 348/222.1 |

FOREIGN PATENT DOCUMENTS

JP        2002-328234        11/2002
WO     WO 2006/035389 A1 *    4/2006 ............ G02F 1/1362

* cited by examiner

*Primary Examiner* — Lex Malsawma
*Assistant Examiner* — Eric Jones
(74) *Attorney, Agent, or Firm* — Sheridan Ross P.C.

(57) ABSTRACT

A solid-state imaging device includes: a photoelectric conversion device; a wire grid polarizer provided on the photoelectric conversion device; and a conductive film electrically connecting conductive layers provided in the photoelectric conversion device to the wire grid polarizer.

18 Claims, 9 Drawing Sheets

SOLID-STATE IMAGING DEVICE, MANUFACTURING METHOD OF SOLID-STATE IMAGING DEVICE AND ELECTRONIC APPARATUS

FIELD

The present disclosure relates to a solid-state imaging device having a wire grid polarizer (WGP), a manufacturing method of the solid-state imaging device and an electronic apparatus including the solid-state imaging device.

BACKGROUND

An optical system incorporating a polarizer is used in solid-state imaging devices such as CCD and CMOS image sensors. The occasion of using the polarizer is increasing according to the necessity of separately handing light rays for the right eye and for the left eye particularly in an application of stereoscopic video (3D) used as a function in a video camera, a digital still camera, portable devices and so on. The polarizer in the solid-state imaging device is generally provided on the outside of an imaging device as a different component from the imaging device in a contact state or non-contact state of a polarizing filter.

As an inorganic polarizer, a wire grid polarizer (WGP) is proposed (for example, see JP-2002-328234 (Patent Document 1)). There are a reflection-type wire grid polarizer and an absorption-type wire grid polarizer as the wire grid polarizer. The reflection-type wire grid polarizer includes strip-shaped reflection layers formed in one dimensional grid state with a smaller pitch than a light wavelength band to be used. The absorption-type wire grid polarizer includes reflection layers made of strip-shaped thin films formed in one dimension grid state with a smaller pitch than the light wavelength band to be used, a dielectric layer formed on the reflection layers and an absorption layer formed on the dielectric layer.

SUMMARY

However, the above-described wire grid polarizer is in an electrically floating state because the polarizer is formed on a transparent flat surface formed by a dielectric layer made of a silicon oxide film and so on. Therefore, adhesion of electrostatic dust and so on to the wire grid polarizer will be a problem.

It is therefore desirable to provide a solid-state imaging device capable of suppressing adhesion of electrostatic dust to the wire grid polarizer, a manufacturing method thereof and an electronic apparatus including the solid-state imaging device.

An embodiment of the present disclosure is directed to a solid-state imaging device including a photoelectric conversion device, a wire grid polarizer provided on the photoelectric conversion device, and a conductive film electrically connecting conductive layers provided in the photoelectric conversion device to the wire grid polarizer.

Another embodiment of the present disclosure is directed to a manufacturing method of a solid-state imaging device including preparing a solid-state imaging device, forming a wire grid polarizer on the photoelectric conversion device, and forming a conductive film connecting the wire grid polarizer to conductive layers provided in the photoelectric conversion device.

Yet another embodiment of the present disclosure is directed to an electronic apparatus including the above solid-state imaging device, an optical system introducing incident light into an imaging unit of the solid-state imaging device, and a signal processing circuit processing an output signal of the solid-state imaging device.

In the solid-state imaging device according to the embodiment of the present disclosure and the solid-state imaging device manufactured by the manufacturing method of the solid-state imaging device according to the embodiment of the present disclosure, the wire grid polarizer is electrically connected to the conductive layers of the photoelectric conversion device by the conductive film. Accordingly, the conductive layers of the wire grid polarizer are not in an electrically floating state, which can suppress adhesion of electrostatic dust and the like. Similarly, also in the electronic apparatus according to the embodiment of the present disclosure, it is possible to suppress adhesion of electrostatic dust and the like to the wire grid polarizer provided on the solid-state imaging device.

According to the embodiment of the present disclosure, it is possible to provide a solid-state imaging device capable of suppressing adhesion of dust to the wire grid polarizer, a manufacturing method thereof and an electronic apparatus including the solid-state imaging device.

DETAILED DESCRIPTION

Hereinafter, embodiments of the present disclosure will be explained, however, the present disclosure is not limited to the following examples.

The explanation will be made in the following order.
1. Embodiment of Solid-State Imaging Device
2. Embodiment of Manufacturing Method of Solid-State Imaging Device
3. Modification Examples of Solid-State Imaging Device
4. Embodiment of Electronic Apparatus

1. EMBODIMENT OF SOLID-STATE IMAGING DEVICE

Structure Example of a Solid-State Imaging Device

Schematic Structural View

A specific embodiment of a solid-state imaging device according to the embodiment will be explained below.

Figure 1:
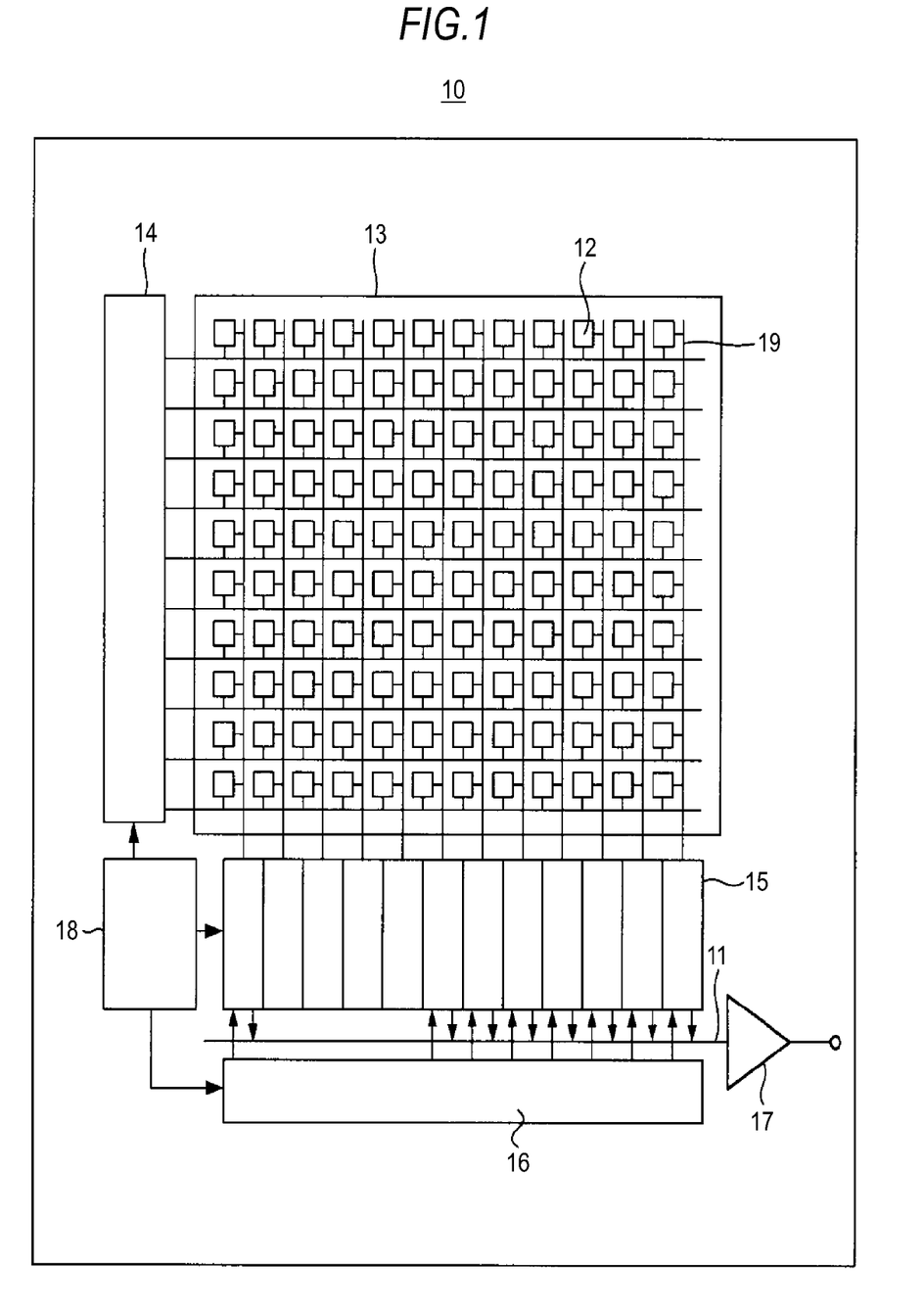
FIG. 1 is a view showing a structure of a solid-state imaging device according to an embodiment of the present disclosure.

FIG. 1 shows a schematic structural view of a MOS (Metal oxide Semiconductor)-type solid-state imaging device as an example of the solid-state imaging device.

A solid-state imaging device 10 shown in FIG. 1 includes a pixel unit (so-called an imaging area) 13 in which pixels 12 having plural photodiodes as photoelectric conversion units are regularly arranged in a two dimensional manner on a semiconductor substrate, for example, a silicon substrate and a peripheral circuit unit. Each pixel 12 has a photodiode and plural pixel transistors (so-called MOS transistors).

Plural pixel transistors can include, for example, three transistors, which are a transfer transistor, a reset transistor and an amplifier transistor. It is also possible to include four transistors by adding a selection transistor.

The peripheral circuit unit includes a vertical drive circuit 14, column signal processing circuits 15, a horizontal drive circuit 16, an output circuit 17, a control circuit 18 and so on.

The control circuit 18 generates clock signals and control signals to be references for operations of the vertical drive circuit 14, the column signal processing circuits 15, the horizontal drive circuit 16 and so on based on a vertical synchronization signal, a horizontal synchronization signal and a master clock. The control circuit 18 inputs these signals into the vertical drive circuit 14, the column signal processing circuits 15, the horizontal drive circuit 16 and so on.

The vertical drive circuit 14 is formed by, for example, a shift register. The vertical drive circuit 14 selectively scans respective pixels 12 in the pixel unit 13 in the vertical direction sequentially on a row basis and supplies pixel signals to the column signal processing circuits 15 based on signal charges generated in accordance with light receiving amounts in photoelectric conversion devices in respective pixels 12 through vertical signal lines 19.

The column signal processing circuits 15 are arranged with respect to, for example, respective columns of the pixels 12, performing signal processing such as noise removal to signals outputted from pixels 12 of one row by using signals from black reference pixels (formed on the periphery of an effective pixel area) on a pixel column basis. That is, the column signal processing circuit 15 performs signal processing such as CDS (correlated double sampling) for removing fixed pattern noise peculiar to pixels 12 or signal amplification. At an output stage of the column signal processing circuits 15, horizontal selection switches (not shown) are provided by being connected between the column signal processing circuits 15 and a horizontal signal line 11.

The horizontal drive circuit 16 is formed by, for example, the shift register, sequentially selecting respective column signal processing circuits 15 by sequentially outputting a horizontal scanning pulse, and outputting pixel signals from the respective column signal processing circuits 15 to the horizontal signal line 11.

The output circuit 17 performs signal processing with respect to signals sequentially supplied from the respective column processing circuits 15 through the horizontal signal line 11 and outputting the signals.

When the above solid-state imaging device 10 is applied to a back-illuminated solid-state imaging device, a wiring layer is not formed on a back surface side as a light incident surface (so-called light receiving surface) and the wiring layer is formed on a front surface opposite to the light receiving surface.

Structure Example of the Solid-State Imaging Device

Wire Grid Polarizer

Figure 2:
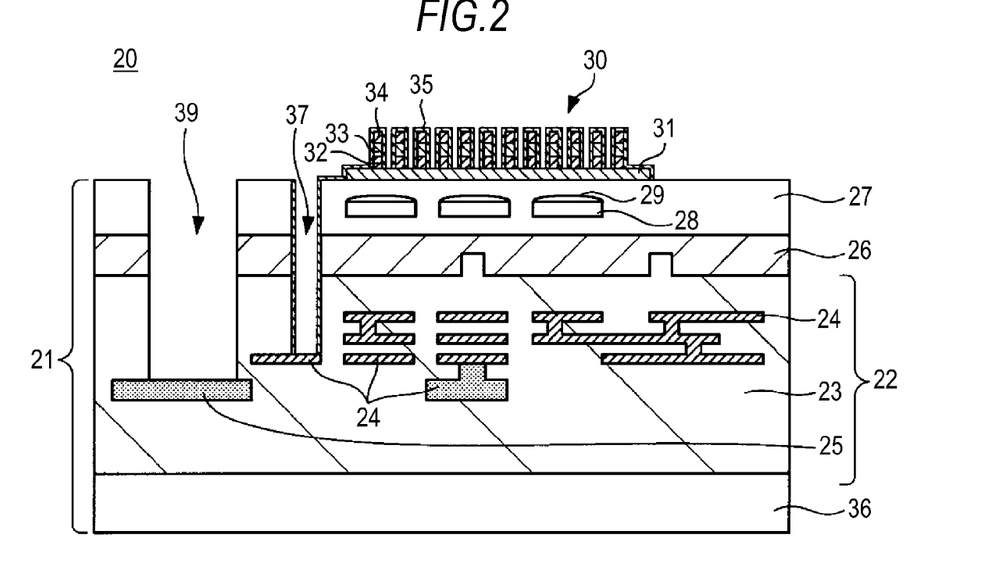
FIG. 2 is a cross-sectional view showing a structure of the solid-state imaging device according to the embodiment of the present disclosure.

Next, a structure of a solid-state imaging device on which a wire grid polarizer is mounted will be explained. FIG. 2 shows a schematic structure view (cross-sectional view) of a solid-state imaging device having the wire grid polarizer.

On solid-state imaging device 20 shown in FIG. 2, a wire grid polarizer 30 is mounted on a photoelectric conversion unit 21. The photoelectric conversion unit 21 includes a wiring layer 22, a semiconductor layer 26 and an optical unit 27 on a support substrate 36. The photoelectric conversion device 21 shown in FIG. 2 is an example of a so-called back-illuminated image sensor which includes not-shown photodiodes and various transistors in the semiconductor layer and the optical unit 27 is formed on a surface opposite to a surface on which the wiring layer 22 is formed.

Plural conductive layers 24 are formed in an interlayer insulating layer 23 in the wiring layer 22, which forms a multilayer wiring layer having a structure in which plural interlayer insulating layers 23 and conductive layers 24 are stacked. Also in the wiring layer 22, there is provided a pad electrode 25 including the conductive layer 24 for connecting the photoelectric conversion device 21 to an external device by wire bonding and so on.

In the optical unit 27, color filters 28, and micro-lenses 29 corresponding to respective pixels are included.

The photoelectric conversion device 21 has a through hole 37 which opens from the surface on which the optical unit 27 is formed to the conductive layers 24 of the wiring layer 22. The photoelectric conversion device 21 also has a through hole 39 which opens from the surface on which the optical unit 27 is formed to the pad electrode 25 of the wiring layer 22.

The solid-state imaging device 20 has the wire grid polarizer 30 on a base layer 31 formed on the optical unit 27 of the photoelectric conversion device 21. The wire grid polarizer 30 is formed by a stacked body including reflection layers 32 formed on the base layer 31, a dielectric layer 33 formed on the reflection layers 32 and an absorption layer 34 formed on the dielectric layer 33. The wire grid polarizer 30 further includes a conductive film 35 covering the whole surface of the base layer 31, the reflection layers 32, the dielectric layer 33 and the absorption layer 34, which is continuously formed to the conductive layers 24 at the bottom of the through hole 37, for example, a grounding layer of the photoelectric conversion device. Accordingly, the reflection layers 32, the dielectric layer 33 and the absorption layer 34 of the wire grid polarizer 30 are electrically connected to the conductive layers 24 in the wiring layer 22 by the conductive film 35.

The reflection layers 32 are formed by strip-shaped thin layers extending in a direction parallel to the principal surface of the photoelectric conversion device 21 in a one-dimensional grid state with a smaller pitch than a wavelength of a visible light range. The direction in which the reflection layers 32 extend in the one-dimensional grid state (direction parallel to the extending direction of the reflection layers 32) corresponds to polarizing orientation for light extinction. The direction in which one-dimensional grids repeat (direction orthogonal to the extending direction of the reflection layers 32) corresponds to the polarizing orientation for light transmission.

That is, the reflection layers 32 have a function of a common wire grid polarizer, attenuating polarized waves having an electric-field component in the direction parallel to the direction in which the reflection layers 32 extend (TE wave/S wave, or one of TM wave/P wave) in light incident in repeating units of the reflection layers 32. The reflection layers 32 transmit polarized waves having an electric-field component in the direction orthogonal to the direction in which the reflection layers 32 extend (TE wave/S wave, or one of TM wave/P wave).

For the reflection layers 32, grid materials for the normal wire grid polarizer can be used. For example, metal materials or semiconductor materials such as aluminum (Al), silver (Ag), gold (Au), copper (Cu), platinum (Pt), molybdenum (Mo), chromium (Cr), titanium (Ti), nickel (Ni), tungsten (W), iron (Fe), silicon (Si), germanium (Ge), tellurium (Te) and so on as well as alloy materials including the above can be used. It is also possible to form the reflection layers 32 from an organic material layer or a resin layer in which reflectance on the surface is increased by tinting and so on.

The dielectric layer 33 is formed on the reflection layers 32. The dielectric layer 33 is made of an optical material transparent to visible light. The dielectric layer 33 is formed by using, for example, materials of $SiO_2$, $Al_2O_3$ and $MgF_2$.

The dielectric layer 33 is a base layer of the absorption layer 34. The dielectric layer 33 is formed for adjusting phases of polarized light reflected on the absorption layer 34 and polarized light transmitted through the absorption layer 34 and reflected on the reflection layers 32 and reducing the reflectance by interference effect. Accordingly, it is preferable that the dielectric layer 33 is formed to have a thickness in which the phase of polarized light reflected on the reflection layers 32 is shifted from polarized light reflected on the absorption layer 34 by half-wavelength. As the absorption layer 34 has light absorption effect, it is possible to improve the extinction ratio even when the thickness of the dielectric layer 33 is not optimized for the interference effect.

A refractive index of the dielectric layer 33 is preferably higher than 1.0 as well as 2.5 or less. As optical characteristics of the absorption layer 34 are affected also by an ambient refractive index, it is possible to control polarizer characteristics of the wire grid polarizer 30 by adjusting the refractive index of the dielectric layer 33.

The absorption layer 34 is intermittently formed in the one-dimensional grid direction of the reflection layers 32 with spaces on the dielectric layer 33. That is, a planar shape of the absorption layer 34 on the dielectric layer 33 is a rectangular island pattern. The absorption layer 34 is formed to have the planer shape in which a long edge of the absorption layer 34 is parallel to the direction in which the reflection layers 32 extend. The absorption layer 34 is also formed so that a short edge thereof is orthogonal to the direction in which the reflection layers 32 extend. Then, the direction of the long edge of the absorption layer 34 is a light absorption axis of the polarizer and the direction of a short edge thereof is a light transmission axis of the polarizer.

The absorption layer 34 is made of metal materials, alloy materials and semiconductor materials having extinction coefficients other than "0", namely, having light absorption effect. The absorption layer 34 is formed by including, for example, inorganic fine particles having light absorption effect. For example, metal materials or semiconductor materials such as aluminum (Al), silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te), tin (Sn) and so on as well as alloy materials including the above can be used. It is also possible to use silicide materials such as $FeSi_2$ (particularly, $\beta$-$FeSi_2$), $MgSi_2$, $NiSi_2$, $BaSi_2$, $CrSi_2$ and $CoSi_2$.

In particular, when semiconductor materials including aluminum or alloys of aluminum, $\beta$-$FeSi_2$, germanium and tellurium are used, high contrast (high extinction ratio) can be obtained in the visible light range. It is preferable to use silver (Ag), copper (Cu), gold (Au) and so on in which a resonance wavelength is close to an infrared range as materials forming the absorption layer for allowing the wavelength bands other than visible light, for example, the infrared range to have polarizing characteristics.

The conductive film 35 is made of thin films such as tungsten (W), ITO (Indium Tin Oxide), $TiO_2$ and carbon. The conductive film 35 is formed in a thickness not interfering with light to be incident on the pixel unit, for example, in a range of 10 nm or less.

Figure 3:
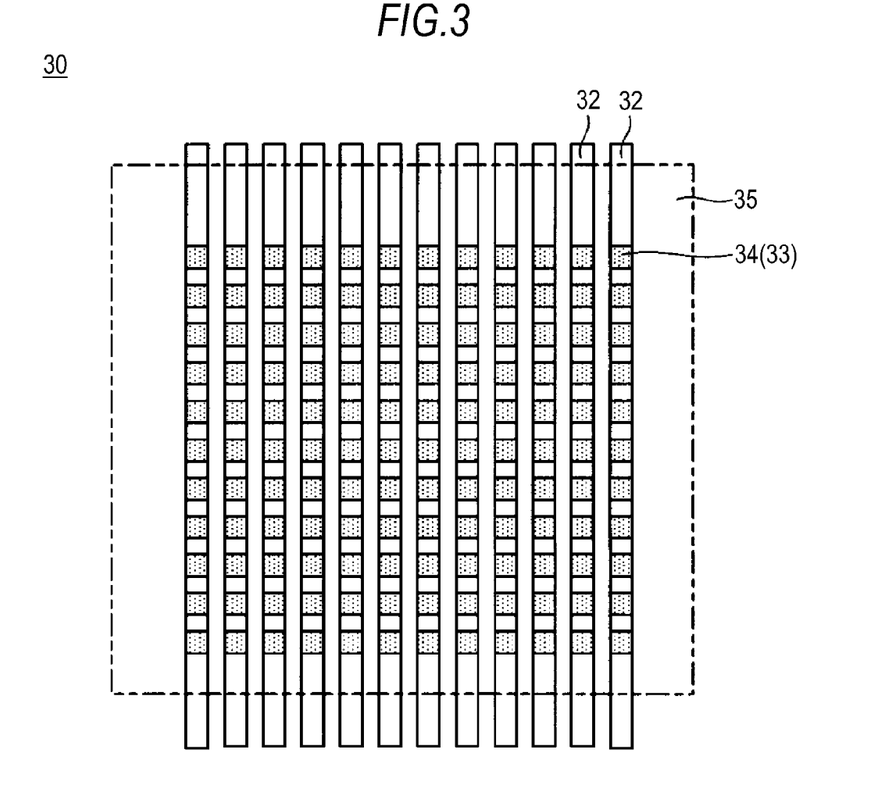
FIG. 3 is a plan view showing structures of a wire grid polarizer and a conductive film provided in the solid-state imaging device.

A plan view of the wire grid polarizer 30 in which the conductive film 35 is formed is shown in FIG. 3. As shown in FIG. 3, the conductive film 35 is formed so as to cover almost the entire area in which the reflection layers 32 of the wire grid polarizer 30 are formed. Therefore, all the reflection layers 32, the dielectric layer 33 and the absorption layer 34 forming the wire grid polarizer 30 touch the conductive film 35.

The base layer 31 is a layer for planarization for forming the wire grid polarizer 30, which is made of silicide materials such as $SiO_2$, SiN and LTO (Low-temperature Oxidation). The base layer 31 is formed by, for example, a sputtering method, a sol-gel method (method of applying a solution by a spin coat method and allowed to gelate by heat treatment).

Figure 4:
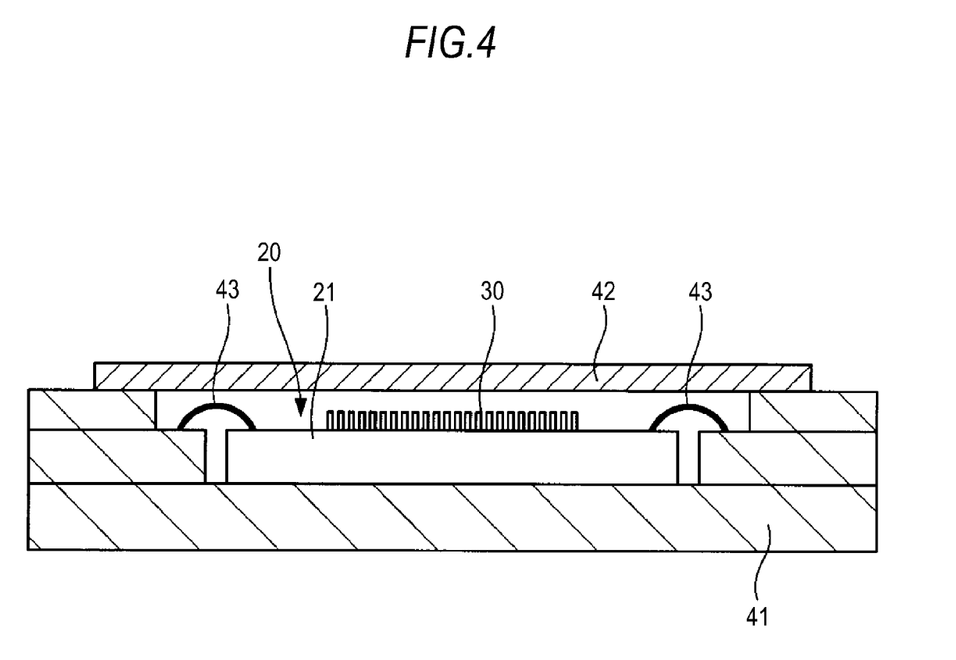
FIG. 4 is a view showing a structure of the solid-state imaging device housed in a package.

Next, a structure of the above solid-state imaging device 20 housed in a package is shown in FIG. 4.

The solid-state imaging device 20 having the wire grid polarizer 30 is mounted in a concave portion of a ceramic package 41. The pad electrodes for wire bonding on the photoelectric conversion device 21 are connected to electrodes of a not-shown external device by wire bonding 43 using gold wires and so on. Then, the solid-state imaging device 20 is sealed by a transparent lid member 42 covering the concave portion of the ceramic package 41.

In the common solid-state imaging device having the wire grid polarizer in related art, when the wire grid polarizer having a structure in which the dielectric layer and the conductive layer are stacked in the vertical direction is provided, the wire grid polarizer is in an electrically floating state. Accordingly, electrostatic dust is liable to be adhered to the surface of the wire grid polarizer and micro-gaps such as gaps in strip-shaped reflection layers. The adhesion of electrostatic dust and soon is liable to occur in a period until the solid-state imaging device is sealed by the transparent lid member in a packaging process performed after the wire grid is formed on the solid-state imaging device. After the sealing by the transparent lid member, dust is shut inside the component permanently, which may cause deterioration of image quality or deterioration of polarization effect. There is also a worry of corrosion of materials due to a chemical reaction between the dust and a semiconductor chip or component materials such as bonding wires.

In response to the above, the surface of the wire grid polarizer 30 in the solid-state imaging device 20 according to the embodiment is covered with the conductive film 35. Additionally, the conductive film 35 is connected to the conductive layers 24 in the through hole 37 piercing through the optical unit 27 and the semiconductor layer 26 of the photoelectric conversion device 21 and opening to the wiring layer 22. Accordingly, the wire grid polarizer 30 is electrically connected to the conductive layers 24 in the wiring layer 22 through the conductive film 35. Therefore, the wire grid polarizer 30 of the solid-state imaging device 20 is not in the electrically floating state. Thus, it is possible to suppress the adhesion of electrostatic dust to the wire grid polarizer 30.

As a result, deterioration of image quality and deterioration of polarization effect caused by adhesion of electrostatic dust and so on to the wire grid polarizer can be suppressed, and occurrence of initial failure and the like of the solid-state imaging device can be also suppressed. It is also possible to suppress the chemical reaction between the electrostatic dust and the semiconductor device or component materials such as bonding wires. Accordingly, it is possible to improve reliability of the solid-state imaging device in long-term use.

In the embodiment, the conductive film 35 covering the wire grid polarizer 30 is electrically connected to the conductive layers 24 in the wiring layer 22 through the through hole 37, however, when the wire grid polarizer 30 is electrically connected to other conductive layers, the above effects can be obtained. Accordingly, the wiring to which the conductive film is connected can be any other conductive layers formed on the photoelectric conversion device 21. For example, a structure in which the pad electrode for wire bonding is connected to the conductive film can be applied.

The wire grid polarizer 30 can be the reflection-type single-layer polarizer only including the reflection layers 32. Also in the case of the single-layer polarizer, the polarizer functions as the normal wire grid polarizer though the operation differs from the above absorption-type wire grid polarizer 30.

As the photoelectric conversion device applied to the solid-state imaging device including the wire grid polarizer 30, devices other than the CMOS image sensor can be used. For example, a CCD image sensor, a CIS (Contact Image Sensor), a CMD (Charge Modulation Device)-type signal amplification image sensor and the like. Additionally, a front-illuminated photoelectric conversion device and the back-illuminated photoelectric conversion device can be used as the photoelectric conversion device.

2. EMBODIMENT OF MANUFACTURING METHOD OF SOLID-STATE IMAGING DEVICE

Next, an embodiment of a manufacturing method of the solid-state imaging device on which the wire grid polarizer is mounted will be explained. In the following explanation, a method of forming the wire grid polarizer 30 on the solid-state imaging device 20 as an example of the manufacturing method of the solid-state imaging device will be explained.

Figure 5A:
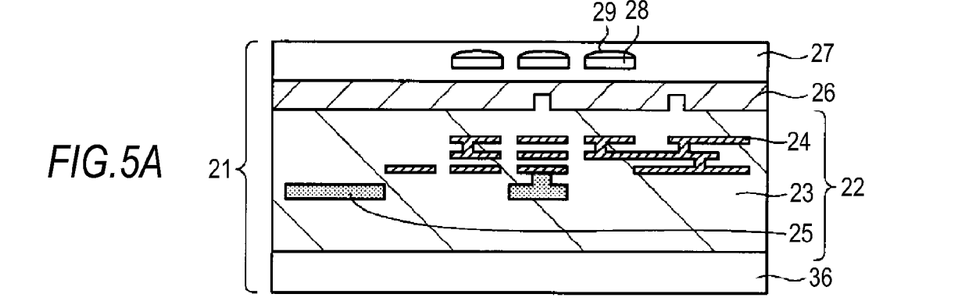
FIGS. 5A to 5D are manufacturing process views of the solid-state imaging device shown in FIG. 2.

First, as shown in FIG. 5A, the photoelectric conversion unit 21 including the wiring layer 22, the semiconductor layer 26 and the optical unit 27 on the support substrate 36 is prepared. FIG. 5A shows the so-called back illuminated solid-state imaging device 21 in which the photodiodes and so on are formed in the semiconductor layer 26 and the optical unit 27 is formed on the surface opposite to the surface on which the wiring layer 22 is formed.

Figure 5B:
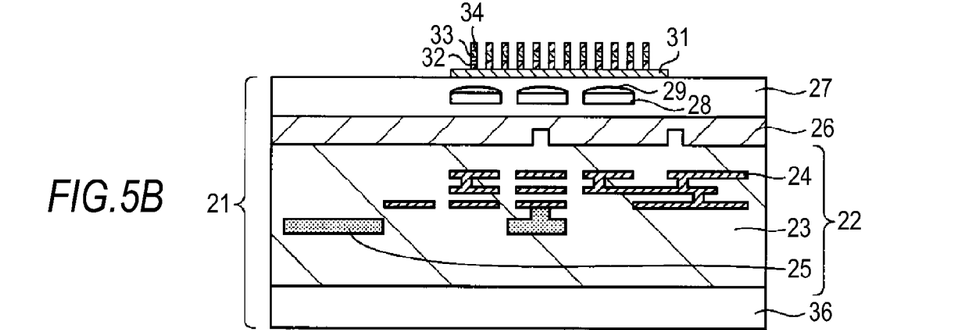

Next, as shown in FIG. 5B, the wire grid polarizer 30 is formed on the surface (light incident side) of the photoelectric conversion device 21.

First, the base layer 31 is formed by using a transparent material in a use wavelength band, for example, $SiO_2$, $Al_2O_3$ and the like on the optical unit 27 of the photoelectric conversion device 21. The base layer 31 is formed by, for example, common vacuum deposition methods such as a vapor deposition method, the sputtering method and a deposition method, or the spin coat method, a dipping method and so on using sol in a state of dispersing the above materials into liquid. The base layer 31 is formed by planarizing the surface of the formed layer. The base layer 31 can be formed only in a region where the wire grid polarizer 30 is mounted, or can be formed in regions other than the region of the wire grid polarizer 30.

After forming the base layer 31, a reflection-layer forming layer for forming the reflection layers 32 on the base layer 31, a dielectric-layer forming layer for forming the dielectric layer 33 and an absorption-layer forming layer for forming the absorption layer 34 are formed by stacking these layers. Specifically, the reflection-layer forming layer made of, for example, aluminum (Al) and so on is formed by the vacuum deposition method as the reflection-layer forming layer. Then, the dielectric-forming layer made of, for example, $SiO_2$ and so on is formed by a CVD method. Moreover, the absorption-layer forming layer made of, for example, tungsten (W) and so on is formed by the sputtering method.

Next, an etching resist layer having a desired island pattern is formed on the absorption-layer forming layer, and the absorption-layer forming layer and the dielectric-layer forming layer are etched by using the etching-resist layer as a mask. Specifically, the absorption-layer forming layer and the dielectric-layer forming layer are patterned based on a well-known lithography technique and a dry etching technique. Accordingly, the island-shaped dielectric layer 33 and the absorption layer 34 are formed on the reflection-layer forming layer.

After forming the island-shaped dielectric layer 33 and the absorption layer 34, a strip-pattern etching resist layer extending in the vertical direction in the drawing is formed so as to cover the entire surface of the device including the reflection-layer forming layer, the dielectric layer 33 and the absorption layer 34. The reflection-layer forming layer is etched by using the strip-shaped etching resist layer as a mask. Accordingly, the strip-shaped reflection layers 32 are formed.

Figure 6:
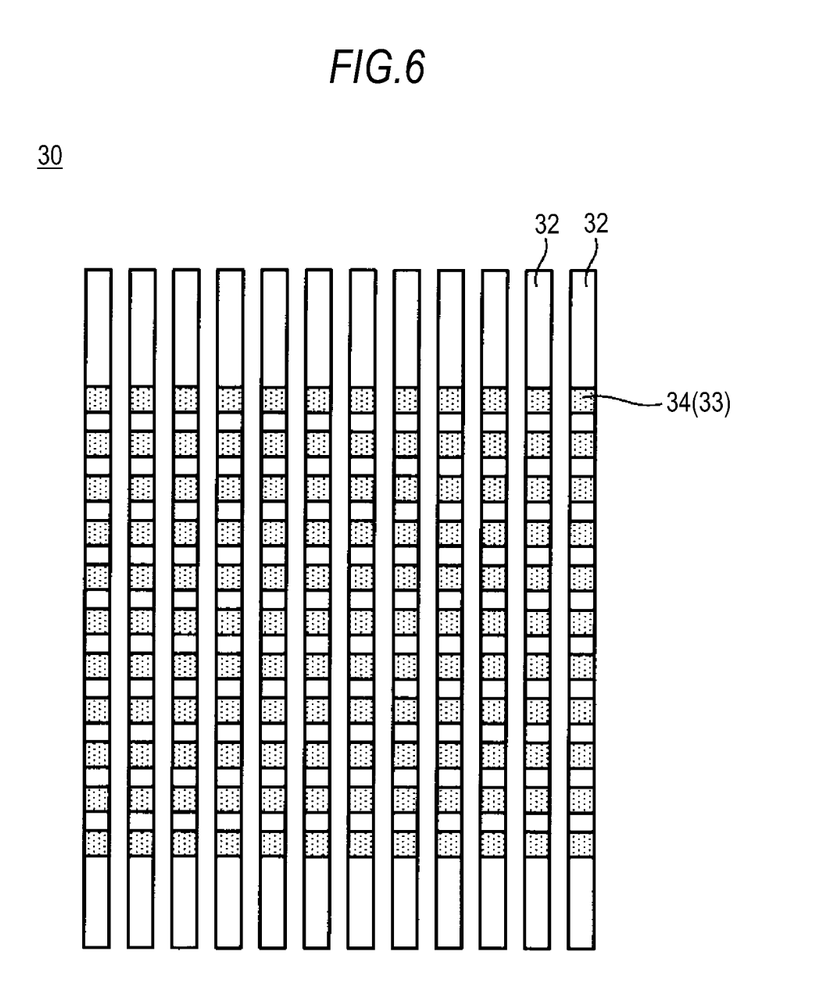
FIG. 6 is a plan view showing a structure of the wire grid polarizer.

According to the above processes, the reflection layers 32 are formed on the base layer 31, and the dielectric layer 33 and the absorption layer 34 are formed on the reflection layers 32 as shown in FIG. 5B. A plan view of the wire grid polarizer 30 in this state is shown in FIG. 6. As shown in FIG. 6, the island-pattern dielectric layer 33 and the absorption layer 34 are formed on the strip-shaped reflection layers 32.

Figure 5C:
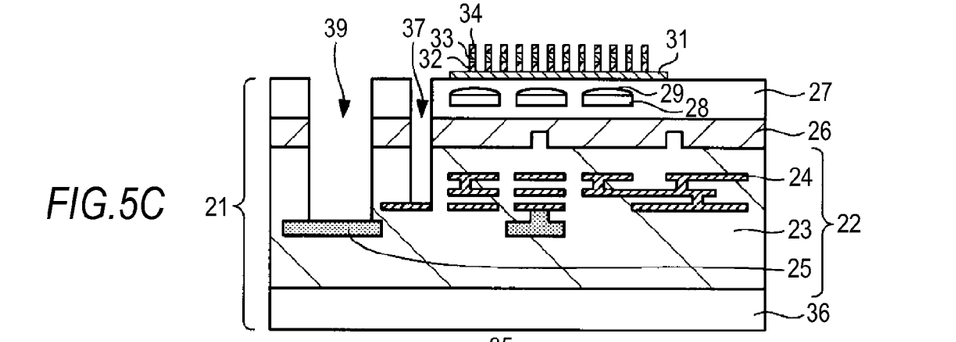

Next, as shown in FIG. 5C, the through hole 37 and the through hole 39 piercing through the optical unit 27 and the semiconductor layer 26 to open from the surface of the photoelectric conversion device 21 to the conductive layer 24 in the wiring layer 22 are formed. The through hole 37 is formed, for example, on the conductive layer 24 to be the grounding layer of the semiconductor device. The through hole 39 is formed, for example, on the conductive layer 24 to be the pad electrode 25 for wire bonding. In the process, the through hole 37 can be formed at the same time as the process of forming the through hole 39 by a well-known method to open the pad electrode 25 for wire bonding.

Figure 5D:
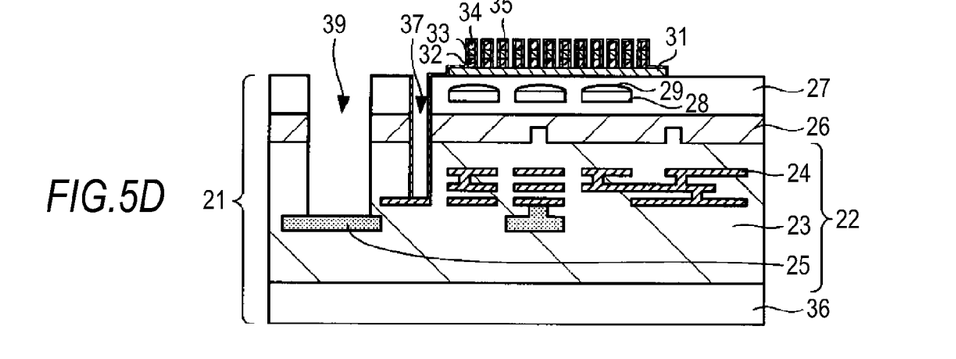

Next, as shown in FIG. 5D, the conductive film 35 is formed on the wire grid polarizer 30 and in the through hole 37.

First, a not-shown insulating layer or a barrier metal layer are formed in an inner wall of the through hole 37 according to need. Then, the conductive film 35 is formed on the surface of the photoelectric conversion device 21 and inside the through hole 37 by using the well-known sputtering method, the deposition method, a plating method and the like. After forming the conductive film 35, the etching resist layer covering a region of forming the wire grid polarizer 30 and covering from the wire grid polarizer 30 to the through hole 37 are pattern-formed by using a well-known lithography technique. Then, the conductive film exposed from the etching resist layer is etched by using a well-known dry etching method and the like. According to the process, the conductive film 35 is formed continuously from the inside of the through hole 37 to the wire grid polarizer 30 as shown in FIG. 5D.

According to the above process, the solid-state imaging device 20 on which the wire grid polarizer 30 is mounted on the photoelectric conversion device 21 can be formed. According to the above manufacturing method, the wire grid polarizer 30 is electrically connected to the conductive layers 24 in the wiring layer 22 through the conductive film 35 covering the wire grid polarizer 30 and formed inside the through hole 37. Therefore, the wire grid polarizer 30 is not in the electrically floating state, which suppresses the adhesion of electrostatic dust.

Additionally, the through hole 37 can be formed at the same time as the related-art process of opening the pad electrode for wire bonding. Therefore, it is possible to manufacture the solid-state imaging device 20 according to the embodiment without adding the process of forming the through hole 37.

3. MODIFICATION EXAMPLES OF SOLID-STATE IMAGING DEVICE

Next, modification examples of the solid-state imaging device according to the above embodiment will be explained. In the following explanation, the same numerals are given to the same components as the above embodiment and explanation thereof will be omitted.

Modification Example 1

Conductive Film

Figure 7A:
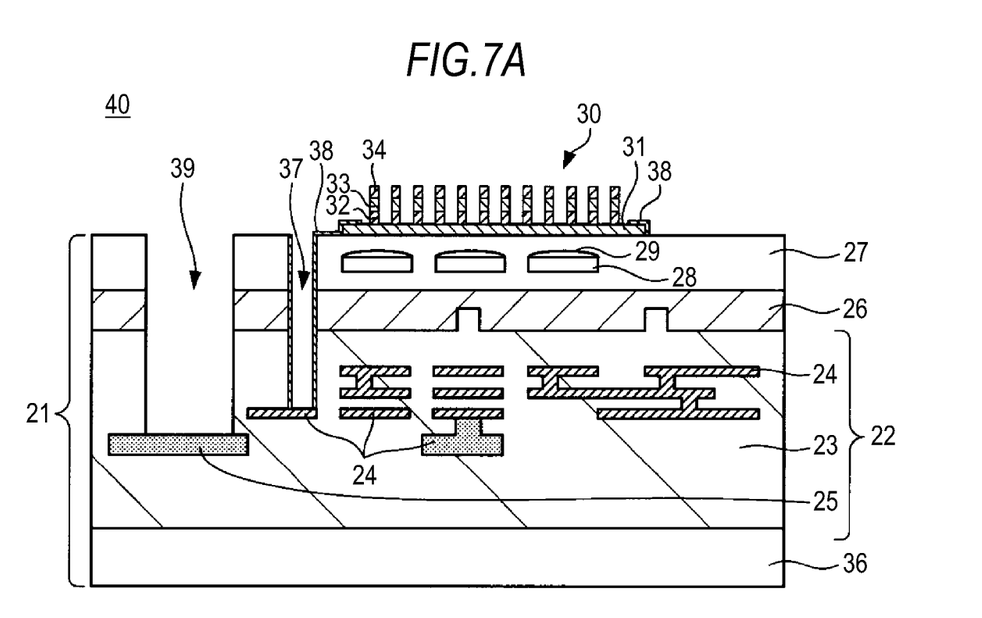
FIG. 7A is a cross-sectional view showing a structure of a modification example of the solid-state imaging device according to the embodiment of the present disclosure and FIG. 7B is a plan view showing structures of the wire grid polarizer and a conductive film.
Figure 7B:
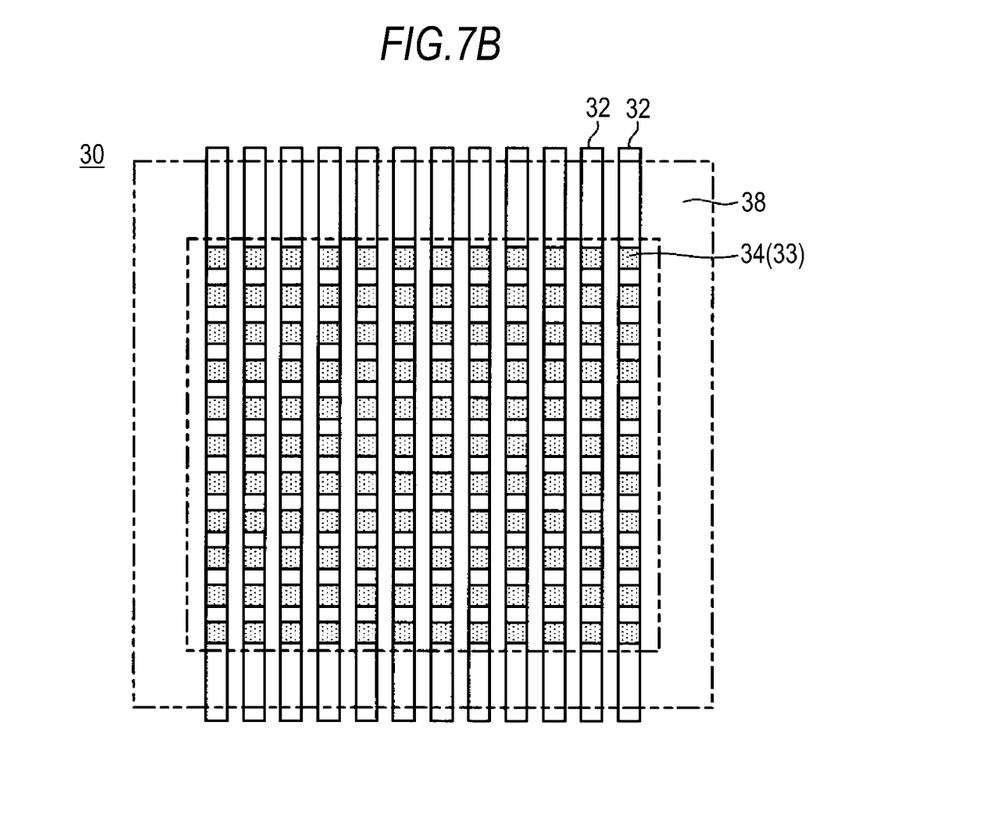

Next, a solid-state imaging device 40 according to a modification example 1 is shown in FIGS. 7A and 7B. FIG. 7A is a cross-sectional view of the solid-state imaging device 40 on which the wire grid polarizer 30 is mounted and FIG. 7B is a plan view showing the wire grid polarizer 30 mounted on the solid-state imaging device 40 and a conductive film 38.

The solid-state imaging device 40 shown in FIGS. 7A and 7B differs from the solid-state imaging device 20 according to the embodiment shown in FIG. 2 and FIG. 3 in a forming position of the conductive film 38.

As shown in FIG. 7B, the conductive film 38 of the solid-state imaging device 40 is formed at a position to be connected to the strip-shaped reflection layers 32 at the periphery of the wire grid polarizer 30. The conductive film 38 is not formed at the region where the dielectric layer 33 and the absorption layer 34 of the wire grid polarizer 30 are formed. That is, the conductive film 38 is formed so as to surround the periphery of the wire grid polarizer 30, which is formed at least at a position to be connected to the whole strip-shaped reflection layers 32 of the wire grid polarizer 30. Accordingly, the conductive film 38 is formed at a position other than the region where the photodiodes of the photoelectric conversion device 21 are formed.

The conductive film 38 is formed continuously from the surface of the photoelectric conversion device 21 to the conductive layer 24 in the wiring layer 22 via the through hole 37. According to the structure, the reflection layers 32 of the wire grid polarizer 30 and the conductive layers 24 in the wiring layer 22 are electrically connected.

The solid-state imaging device 40 according to the modification example 1 shown in FIGS. 7A and 7B can be manufactured by changing the pattern of the etching resist layer to be used in the process of forming the conductive film 35 shown in FIG. 5D in the manufacturing processes of the solid-state imaging device 20 according to the above embodiment.

The wire grid polarizer 30 is formed by centering the photodiodes in the pixel unit of the photoelectric conversion device 21. Therefore, when the conductive film is formed at the center of the wire grid polarizer 30, the conductive film will be an obstacle to light incident on the photodiodes, which incurs the reduction of the light amount and the reduction of sensitivity. On the other hand, in the solid-state imaging device 40 according to the modification example 1, the conductive film 38 is formed only at the periphery of the wire grid polarizer 30, and the conductive film 38 is not formed at the center of the wire grid polarizer 30, which is over the photodiodes. As the conductive film 38 is not formed at the center of the wire grid polarizer 30, it is possible to secure the light amount reaching the photodiodes of the photoelectric conversion device 21 and to prevent the reduction of sensitivity as compared with the solid-state imaging device according to the above embodiment.

Also in the solid-state imaging device 40 according to the modification example 1, the reflection layers 32 are electrically connected to the conductive layers 24 in the wiring layer 22 through the conductive film 38, therefore, the reflection layers 32 are not in the electrically floating state. Accordingly, it is possible to suppress the adhesion of electrostatic dust to the reflection layers 32, particularly, adhesion of electrostatic dust to micro-gaps in the strip-shaped reflection layers 32. In the structure of the conductive film 38, the whole wire grid polarizer is not in the electrically floating state when the wire grid polarizer is formed only by the reflection layers, which is effective for suppressing the adhesion of electrostatic dust and preventing the reduction of sensitivity characteristics.

Modification Example 2

Reflection Layers

Figure 8A:
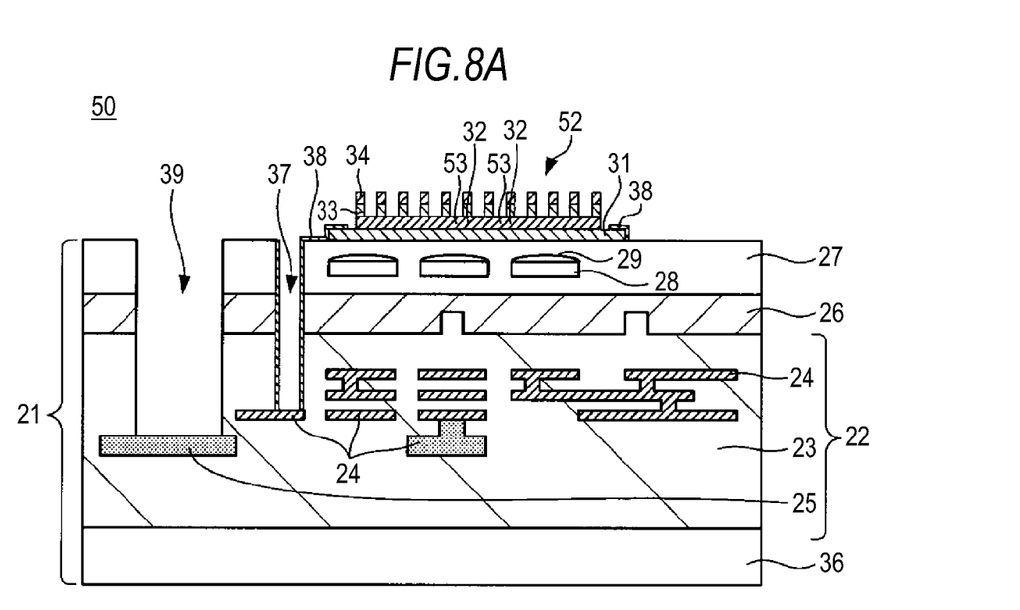
FIG. 8A is a cross-sectional view showing a structure of a modification example of the solid-state imaging device according to the embodiment of the present disclosure and FIG. 8B is a plan view showing structures of a wire grid polarizer and the conductive film.
Figure 8B:
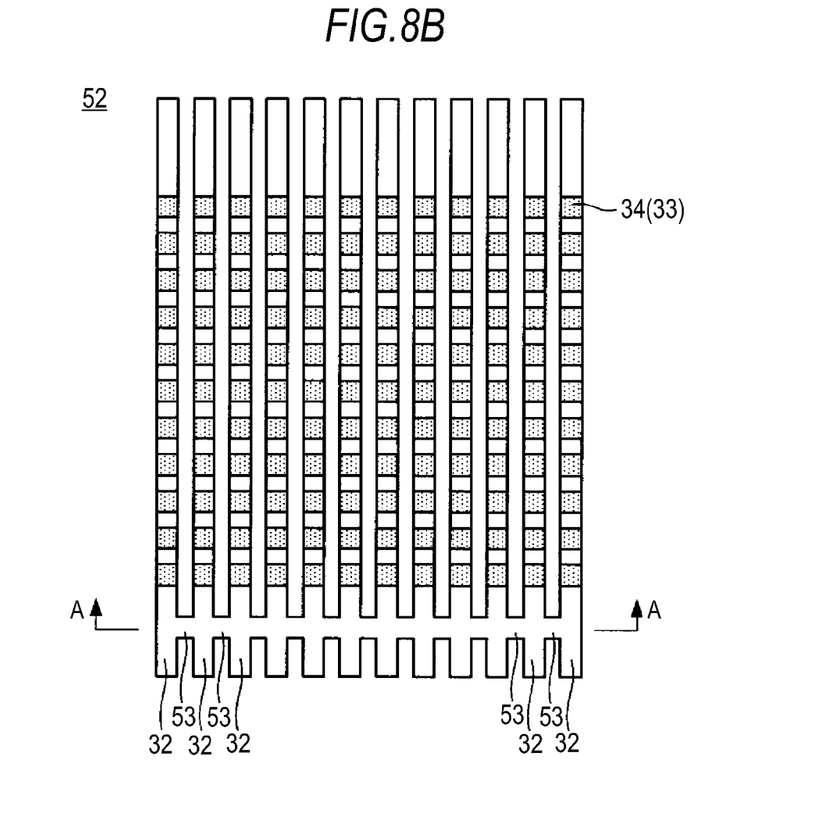

Next, a solid-state imaging device 50 according to a modification example 2 is shown in FIGS. 8A and 8B. FIG. 8A is a cross-sectional view of the solid-state imaging device 50 on which a wire grid polarizer 52 is mounted and FIG. 8B is a plan view showing the wire grid polarizer 52 mounted on the solid-state imaging device 50. The wire grid polarizer 52 shown in FIG. 8A shows a cross-section of the wire grid polarizer 52 shown in FIG. 8B taken along the line A-A'.

The solid-state imaging device 50 shown in FIGS. 8A and 8B differs from the solid-state imaging device 20 according to the embodiment shown in FIG. 2 and FIG. 3 in a structure of the reflection layers 32 and a forming position of the conductive film 38.

The wire grid polarizer 52 includes the reflection layers 32 formed in one-dimensional grid state and a conductive layer orthogonal to the reflection layers 32 extending in one-dimensional grid state and electrically connecting between respective reflection layers 32. The island-shaped dielectric layer 33 and the absorption layer 34 are formed on the strip-shaped reflection layers 32.

The conductive layer 53 can be made of, for example, the same material as the reflection layer 32. The conductive layer 53 is formed so that all strip-shaped reflection layers 32 formed in the wire grid polarizer 52 are electrically connected. Accordingly, all the reflection layers 32 and the conductive layer 53 are formed in a continuous conductive pattern in the wire grid polarizer 52.

The conductive layer 53 is preferably formed at the periphery of the wire grid polarizer 52 except on the photodiodes of the photoelectric conversion device 21. Accordingly, the conductive layer 53 is formed at a position other than the region where the photodiodes are formed in the photoelectric conversion device 21, which is not an obstacle to light incident on the photodiodes.

Figure 9A:
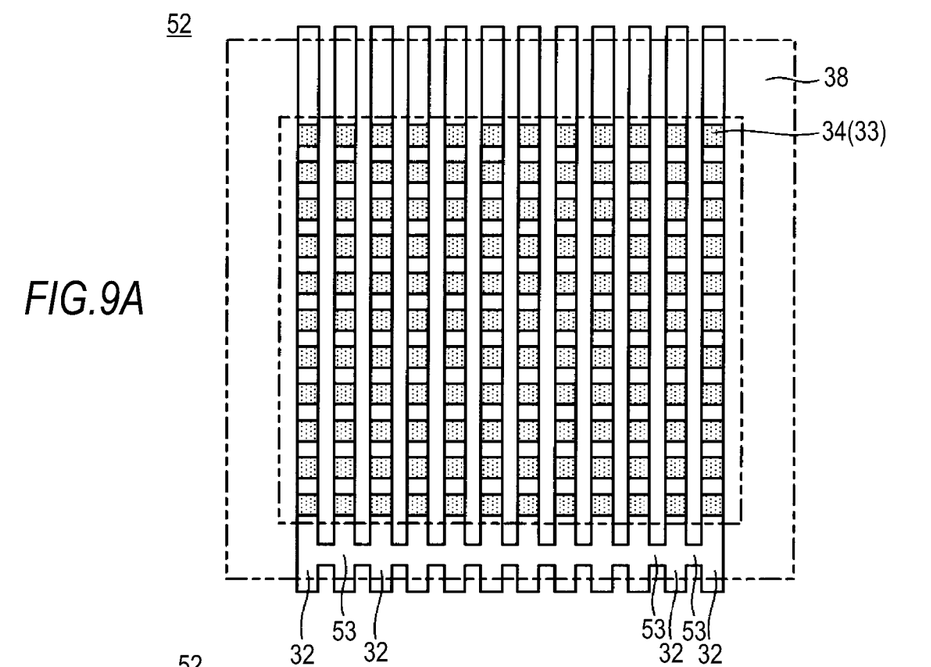
FIGS. 9A and 9B are plan views showing structures of the wire grid polarizer and a conductive film.
Figure 9B:
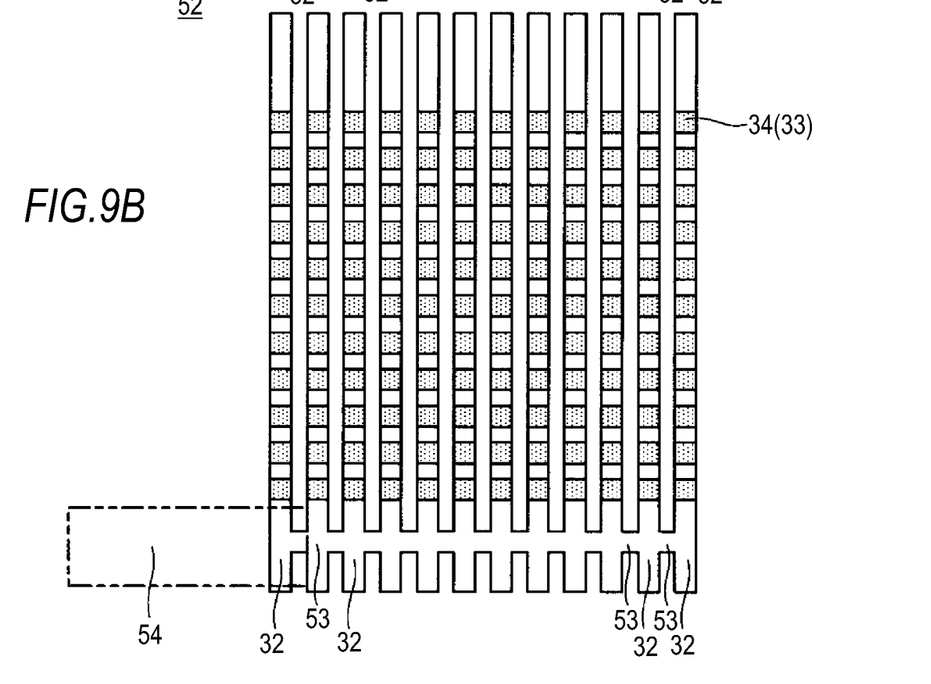

The pattern of the conductive film 38 formed in the solid-state imaging device 50 can be the same pattern as the modification example 1 as shown in FIG. 9A. It is also preferable to apply a pattern of a conductive film 54 as shown in FIG. 9B. The conductive film 54 is connected to at least part of the reflection layers 32 of the wire grid polarizer 52. The conductive film 38 is formed continuously from the surface of the photoelectric conversion device 21 to the conductive layers 24 in the wiring layer 22 via the through hole 37 as shown in FIG. 8A.

All the reflection layers 32 are formed as continuous conductors by providing the conductive layer 53. Accordingly, the conductive film 54 is connected to part of the reflection layers 32, thereby electrically connecting the whole reflection layers of the wire grid polarizer to the conductive layers 24 in the wiring layer 22 through the conductive film 54.

The solid-state imaging device 50 according to the modification example 2 shown in FIG. 8A can be manufactured by changing the etching pattern of the reflection layers 32 in the process of forming the reflection layers 32 of the wire grid polarizer 30 shown in FIG. 5B in the manufacturing processes of the solid-state imaging device 20 according to the above embodiment. For example, the pattern of the etching resist layer at the time of forming the reflection layers 32 by etching is formed to be a pattern of the strip-shaped reflection layers 32 extending in one-dimensional grid state and the conductive layer 53 orthogonal to the strip-shaped reflection layers 32. Then, the reflection-layer forming layer is etched by using the etching resist layer as a mask, thereby forming the reflection layers 32 and the conductive layer 53.

The conductive film 54 shown in FIG. 9B can be manufactured by changing the pattern of the etching resist layer used in the process of forming the conductive film 35 shown in FIG. 5D in the manufacturing processes of the solid-state imaging device 20 according to the above embodiment.

In the structure of the solid-state imaging device 50 according to the modification example 2, components other than the wire grid polarizer are not formed at the center of the wire grid polarizer 52 positioned on the photodiodes in the same manner as the solid-state imaging device 40 according to the modification example 1. Therefore, it is possible to remove obstacles to the incident light by the conductive film and the like and to prevent the reduction of sensitivity of the solid-state imaging device.

4. EMBODIMENT OF ELECTRONIC APPARATUS

Next, an embodiment of an electronic apparatus including the above-described solid-state imaging device will be explained.

The above solid-state imaging device can be applied to electronic apparatuses such as a camera including the solid-state imaging device, a portable device with a camera and other apparatuses having the solid-state imaging device.

Figure 10:
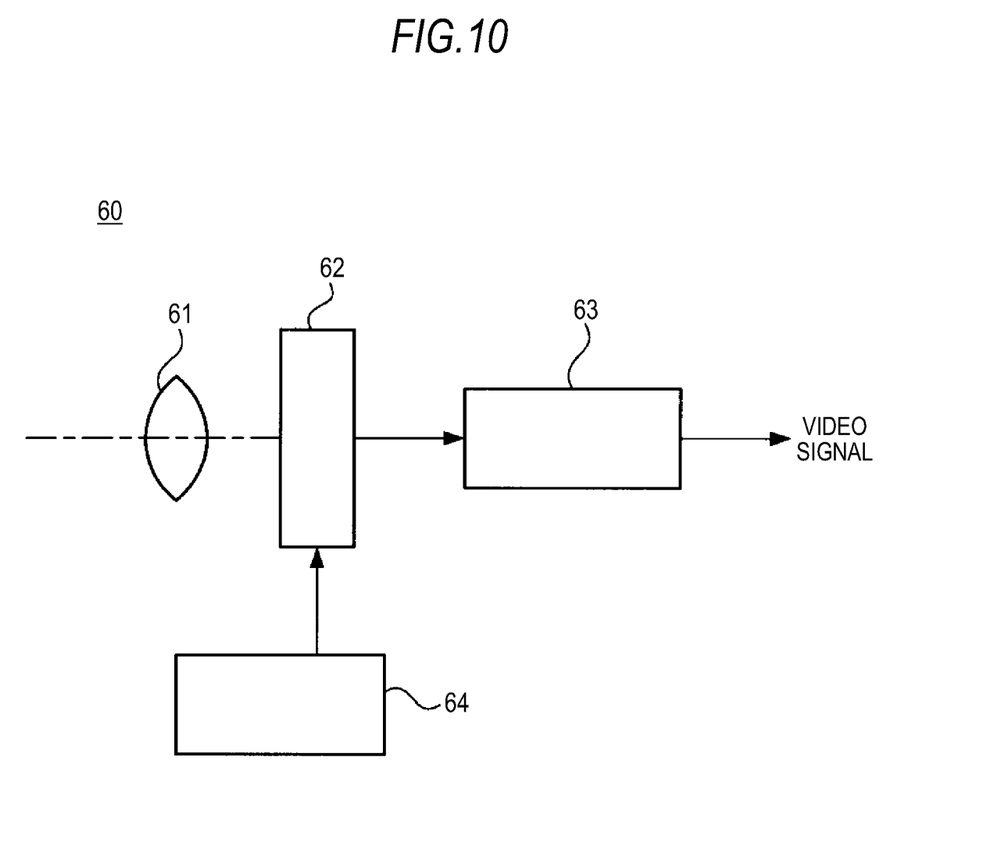
FIG. 10 is a view showing a configuration of an electronic apparatus according to an embodiment of the present disclosure.

FIG. 10 shows a schematic configuration in the case where the solid-state imaging device is applied to a digital still camera capable of taking still images as an example of electronic apparatus.

A camera 60 according to the embodiment includes an optical system (optical lens) 61, a solid-state imaging device 62, a signal processing circuit 63 and a drive circuit 64.

The above solid-state imaging device is applied as the solid-state imaging device 62. The optical lens 61 forms an image of image light (incident light) from an object on an imaging surface of the solid-state imaging device 62. Accordingly, in the photoelectric conversion device of the solid-state imaging device 62, signal charges are accumulated for a fixed period of time. The drive circuit 64 supplies a transfer operation signal of the solid-state imaging device 62. Signal transfer of the solid-state imaging device 62 is performed by a drive signal (timing signal) supplied from the drive circuit 64. The signal processing circuit 63 performs various signal processing to an output signal of the solid-state imaging device 62. A video signal to which the signal processing is performed is stored in a storage medium such as a memory or outputted to a monitor and so on. The camera 60 according to the embodiment includes a form of a camera module in which the optical lens 61, the solid-state imaging device 62, the signal processing circuit 62 and the drive unit 64 are formed into a module.

The above solid-state imaging device 62 can be applied to the camera shown in FIG. 10 or, for example, portable devices with cameras typified by a cellular phone including a camera module.

Additionally, the structure of FIG. 10 can be applied to a module having an imaging function in which the optical lens 61, the solid-state imaging device 62, the signal processing circuit 63 and the drive unit 64 are formed into a module, namely, an imaging-function module. It is also possible to form an electronic apparatus having the imaging-function module.

In the above embodiment, a CMOS image sensor has been explained as an example of the solid-state imaging device, however, the above solid-state imaging device can be applied to solid-state imaging devices other than the CMOS image sensor. Types and systems of the solid-state imaging device are not limited and, for example, a CCD (Charge Coupled Device) image sensor a CMD (Charge Modulation Device) image sensor and so on can be applied.

The present disclosure can apply the following structures.

(1) A solid-state imaging device including
a photoelectric conversion device,
a wire grid polarizer provided on the photoelectric conversion device, and
a conductive film electrically connecting conductive layers provided in the photoelectric conversion device to the wire grid polarizer.

(2) The solid-state imaging device described in the above (1),
in which the photoelectric conversion device has a hole opening from a surface of the photoelectric conversion device to a wiring layer, and the conductive layers of the wiring layer are connected to the conductive film through the hole.

(3) The solid-state imaging device described in the above (1) or (2),
in which the wire grid polarizer is formed by a stacked body including conductive layers and a dielectric layer, and the entire surface of the stacked body is covered with the conductive film.

(4) The solid-state imaging device described in the above (1) or (2), in which the conductive film is connected to the conductive layers included in the wire grid polarizer at the periphery of the wire grid polarizer.

(5) The solid-state imaging device described in any one of the above (1) or (4), in which the wire grid polarizer includes strip-shaped conductive layers and a conductive layer electrically connecting the plural strip-shaped conductive layers.

(6) A manufacturing method of a solid-state imaging device including preparing a solid-state imaging device, forming a wire grid polarizer on the photoelectric conversion device, and forming a conductive film connecting the wire grid polarizer to conductive layers provided in the photoelectric conversion device.

(7) An electronic apparatus including a solid-state imaging device having a photoelectric conversion device, a wire grid polarizer provided on the photoelectric conversion device, and a conductive film electrically connecting conductive layers provided in the photoelectric conversion device to the wire grid polarizer, an optical system introducing incident light into an imaging unit of the solid-state imaging device, and a signal processing circuit processing an output signal of the solid-state imaging device.

The present disclosure contains subject matter related to that disclosed in Japanese Priority Patent Application JP 2011-104897 filed in the Japan Patent Office on May 10, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
 a photoelectric conversion device;
 a wire grid polarizer provided on the photoelectric conversion device, the wire grid polarizer including a plurality of strip-shaped reflection layers formed on a base layer and a plurality of island-shaped stacks having a gap between each island-shaped stack formed on and along a length of each of the strip-shaped reflection layers, wherein each of the island-shaped stacks includes a dielectric layer formed on a respective strip-shaped reflection and an absorption layer formed on the dielectric layer, and wherein each of the plurality of strip-shaped reflection layers extends in a continuous manner beyond the gapped island-shaped stacks in a direction parallel to a principal surface of the photoelectric conversion device and in a grid having a smaller pitch than a wavelength of visible light; and
 a conductive film electrically connecting one or more conductive layers provided in the photoelectric conversion device to the wire grid polarizer, wherein the conductive film contacts the plurality of reflection layers, the dielectric layer, and the absorption layer of the wire grid polarizer.

2. The solid-state imaging device according to claim 1, wherein the photoelectric conversion device has a hole opening from a surface of the photoelectric conversion device to a wiring layer and one or more of the conductive layers of the wiring layer are connected to the conductive film through the hole.

3. The solid-state imaging device according to claim 1, wherein the conductive film is connected to the conductive layers included in the wire grid polarizer at the periphery of the wire grid polarizer.

4. The solid-state imaging device according to claim 1, wherein the wire grid polarizer includes a conductive layer electrically connecting the plural strip-shaped reflection layers.

5. The solid-state imaging device according to claim 1, wherein the photoelectric conversion device is a back-illuminated image sensor.

6. The solid-state imaging device according to claim 1, wherein the conductive film contacts at least a top surface and four side surfaces of the absorption layer such that a gap in the conductive film exists between absorption layers of adjacent island-shaped stacks.

7. A manufacturing method of a solid-state imaging device comprising:
 preparing a solid-state imaging device having a photoelectric conversion device;
 forming a wire grid polarizer on a photoelectric conversion device, the wire grid polarizer including a plurality of strip-shaped reflection layers formed on a base layer and a plurality of island-shaped stacks having a gap between each island-shaped stack formed on and along a length of each of the strip-shaped reflection layers, wherein each of the island-shaped stacks includes a dielectric layer formed on a respective strip-shaped reflection and an absorption layer formed on the dielectric layer, and wherein each of the plurality of strip-shaped reflection layers extends in a continuous manner beyond the gapped island-shaped stacks in a direction parallel to a principal surface of the photoelectric conversion device and in grid having a smaller pitch than a wavelength of visible light; and
 forming a conductive film connecting the wire grid polarizer to one or more conductive layers provided in the photoelectric conversion device, wherein the conductive film contacts the plurality of reflection layers, the dielectric layer, and the absorption layer of the wire grid polarizer.

8. The manufacturing method according to claim 7, further comprising:
 forming a hole opening from a surface of the photoelectric conversion device to a wiring layer such that one or more of the conductive layers of the wiring layer are connected to the conductive film through the hole.

9. The manufacturing method according to claim 7, further comprising:
 connecting the conductive film to the conductive layers included in the wire grid polarizer at the periphery of the wire grid polarizer.

10. The manufacturing method according to claim 7, wherein the wire grid polarizer includes a conductive layer electrically connecting the plural strip-shaped reflection layers.

11. The manufacturing method according to claim 7, wherein the photoelectric conversion device is a back-illuminated image sensor.

12. The manufacturing method according to claim 7, wherein the conductive film contacts at least a top surface and four side surfaces of the absorption layer such that a gap in the conductive film exists between absorption layers of adjacent island-shaped stacks.

13. An electronic apparatus comprising:
 a solid-state imaging device having a photoelectric conversion device; and a wire grid polarizer provided on the photoelectric conversion device, the wire grid polarizer including a plurality of strip-shaped reflection layers formed on a base layer and a plurality of island-shaped stacks having a gap between each island-shaped stack formed on and along a length of each of the strip-shaped reflection layers, wherein each of the island-shaped stacks includes a dielectric layer formed on a respective strip-shaped reflection and an absorption layer formed on the dielectric layer, and wherein each of the plurality of strip-shaped reflection layers extends in a continuous manner beyond the gapped island-shaped stacks in a direction parallel to a principal surface of the photoelectric conversion device and in a grid having a smaller pitch than a wavelength of visible light, and a conductive film electrically connecting one or more conductive layers provided in the photoelectric conversion device to the wire grid polarizer, wherein the conductive film contacts the plurality of reflection layers, the dielectric layer, and the absorption layer of the wire grid polarizer;

an optical system introducing incident light into an imaging unit of the solid-state imaging device; and a signal processing circuit processing an output signal of the solid-state imaging device.

14. The electronic apparatus according to claim 13, wherein the photoelectric conversion device has a hole opening from a surface of the photoelectric conversion device to a wiring layer, and one or more of the conductive layers of the wiring layer are connected to the conductive film through the hole.

15. The electronic apparatus according to claim 13, wherein the conductive film is connected to the conductive layers included in the wire grid polarizer at the periphery of the wire grid polarizer.

16. The electronic apparatus according to claim 13, wherein the wire grid polarizer includes a conductive layer electrically connecting the plural strip-shaped reflection layers.

17. The electronic apparatus according to claim 13, wherein the photoelectric conversion device is a back-illuminated image sensor.

18. The electronic apparatus according to claim 13, wherein the conductive film contacts at least a top surface and four side surfaces of the absorption layer such that a gap in the conductive film exists between absorption layers of adjacent island-shaped stacks.

* * * * *